United States Patent
Horn

(10) Patent No.: US 7,151,462 B2
(45) Date of Patent: Dec. 19, 2006

(54) CIRCUIT ARRANGEMENT AND METHOD FOR LOAD DIAGNOSIS OF A SEMICONDUCTOR SWITCH

(75) Inventor: Wolfgang Horn, Villach (AT)

(73) Assignee: Infineon Technologies AG, Munich (DE)

(*) Notice: Subject to any disclaimer, the term of this patent is extended or adjusted under 35 U.S.C. 154(b) by 314 days.

(21) Appl. No.: 10/909,017

(22) Filed: Jul. 30, 2004

(65) Prior Publication Data

US 2005/0083086 A1    Apr. 21, 2005

(30) Foreign Application Priority Data

Jul. 31, 2003  (DE) .............................. 103 35 083

(51) Int. Cl.
*G08B 21/00*   (2006.01)
(52) U.S. Cl. .................. 340/657; 340/644; 340/650; 361/88; 361/115; 324/76.11; 324/133
(58) Field of Classification Search .............. 340/657, 340/644, 650, 652, 653, 635; 361/88, 115, 361/93.1; 324/765, 122, 133, 769, 76.11
See application file for complete search history.

(56) References Cited

U.S. PATENT DOCUMENTS

| | | | | |
|---|---|---|---|---|
| 4,375,073 A | * | 2/1983 | Glogolja et al. | 361/91.4 |
| 5,570,259 A | * | 10/1996 | Allmeier et al. | 361/86 |
| 5,886,510 A | * | 3/1999 | Crespi et al. | 323/273 |
| 6,828,814 B1 | * | 12/2004 | Gergintschew | 324/765 |
| 6,986,111 B1 | * | 1/2006 | Urakawa | 716/4 |

FOREIGN PATENT DOCUMENTS

DE   197 37 628   1/1999

* cited by examiner

*Primary Examiner*—Toan N. Pham
(74) *Attorney, Agent, or Firm*—Dicke, Billig & Czaja, PLLC

(57) ABSTRACT

The present invention relates to a circuit arrangement and a method for load diagnosis of a switch having a first and a second load connecting terminal. A first and a second current source arrangement are provided, which can in each case be connected to one of the load connecting terminals of the switch and which supply, depending on potential conditions at the said load connecting terminals, currents in a first and second current direction or oppositely to the said first and second current direction to the load connecting terminals. Furthermore, an evaluation circuit is provided, which evaluates the currents flowing to the first and second load connecting terminals and provides a load state signal depending on the said currents.

20 Claims, 10 Drawing Sheets

FIG 11

| Operating state | | | I6 | S8 | S9 |
|---|---|---|---|---|---|
| High-Side | | Normal operation | 2-I1 | High | High |
| | 3 | Open Load | I1 | Low | High |
| | 4 | Short to Battery | 0 | Low | Low |
| Low-Side | | Normal operation | 2-I1 | High | High |
| | 1 | Open Load | I1 | Low | High |
| | 2 | Short to GND | 0 | Low | Low |
| Floating (one load between source and earth, a further load between drain and supply) | | Normal operation | 2-I1 | High | High |
| | 11/12 | Open Load (single) | I1 | Low | High |
| | 11+12 | Open Load (double) | I1/2 | Low | High |
| | 21/22 | Short to Battery/GND (single) | 0 | Low | Low |
| | 21+22 | Short to Battery/GND (double) | 0 | Low | Low |

CIRCUIT ARRANGEMENT AND METHOD FOR LOAD DIAGNOSIS OF A SEMICONDUCTOR SWITCH

CROSS-REFERENCE TO RELATED APPLICATIONS

This Utility Patent Application claims priority to German Patent Application No. DE 103 35 083.7, filed on Jul. 31, 2003, which is incorporated herein by reference.

BACKGROUND

The present invention relates to a circuit arrangement and a method for load diagnosis of a semiconductor switch.

In integrated power switches, many applications require a diagnostic function which, by way of example, serves for identifying an interruption of the line connection to a load connected to the semiconductor switch, or a short circuit of the output to which the load is connected, with respect to a supply potential. Such diagnostic functions are employed both for high-side switches, in which the load is located between the semiconductor switch and a reference-earth potential and for low-side switches, in which the load is located between a supply potential, for example a battery, and the semiconductor switch.

In semiconductor switches which can be used both as high-side switches and as low-side switches, a diagnostic circuit that carries out the diagnosis has to be doubly provided, namely a first diagnostic circuit at a first load terminal and a second diagnostic circuit at a second load terminal of the semiconductor switch. Depending on the instantaneous interconnection of the semiconductor switch and the load, either the results of the first or the second diagnostic circuit are used in this case, which necessitates an initial initialization of the diagnostic circuit depending on the interconnection of the semiconductor switch and the load.

In customary diagnostic circuits a constant current is impressed at the output to which the load is connected, and the voltage level established at the output terminal is used for diagnosis. What is disadvantageous in this case is that, owing to the assessment of voltage levels, this concept is susceptible to so-called earth offsets, that is, fluctuations in the reference-earth potential with respect to which a voltage level is to be determined. Moreover, the diagnosis in known circuits in this case relates only to one connecting terminal of the semiconductor switch, for example, the drain terminal in a power MOSFET used as a low-side switch, or the source terminal in a power MOSFET used as a high-side switch. In this case, the known circuits are unable to carry out a diagnosis if the semiconductor switch is connected up in floating fashion, that is, if a load is located between supply potential and a first load terminal and a load is additionally located between the second load terminal and reference-earth potential.

SUMMARY

One embodiment of the present invention provides a circuit arrangement and a method for load diagnosis of a semiconductor switch that can be used universally both for semiconductor switches in high-side operation and in low-side operation, without necessitating an initialization independently of the interconnection, and that are suitable in particular for diagnosis during floating operation of the semiconductor switch.

The circuit arrangement according to one embodiment of the invention for load diagnosis of a switch having a first and a second load connecting terminal comprises a first current source arrangement with a first connecting terminal, that can be connected to the first load connecting terminal of the switch. The first current source arrangement is designed to supply a current in a first current direction to the first connecting terminal if the first load terminal is coupled to a first supply potential, and to supply a current in an opposite current direction to the first connecting terminal if the first load terminal is coupled to a second supply potential. The circuit arrangement furthermore comprises a second current source arrangement with a second connecting terminal, which can be connected to the second load connecting terminal of the switch. The second current source arrangement is designed to supply a current in a second current direction to the second connecting terminal if the second load terminal is coupled to the second supply potential, and to supply a current in an opposite direction to the second connecting terminal if the second load terminal is coupled to the first supply potential. In order to evaluate the currents flowing to the first and second connecting terminals, an evaluation circuit is present, which provides a load state signal depending on the said currents.

Consequently, in the circuit arrangement according to one embodiment of the invention, currents are impressed on the first and second connecting terminals, which are connected to the load terminals of the semiconductor switch during the diagnosis, and the directions of these currents that are established in a manner dependent on the load state at the said connecting terminals are determined in order to provide a load state signal dependent on the load state.

By way of example, the load state signal assumes a first state, which indicates a fault-free operation, if a current flows in the first direction to the first connecting terminal and a current flows in the second direction to the second connecting terminal, that is, if the first connecting terminal is coupled to the first supply potential and the second connecting terminal is coupled to the second supply potential.

The load state signal assumes a second state, which indicates a first faulty operation, if no current flows to the first connecting terminal and/or if no current flows to the second connecting terminal. This state occurs if the first connecting terminal is coupled neither to the first supply potential nor to the second supply potential, that is, if the semiconductor switch turns off and a line connection between the semiconductor switch and the first supply potential is interrupted, which indicates, for example, chopping of the load. The load state signal also assumes a second state when the semiconductor switch turns off and when a line connection between the second connecting terminal and the second supply potential is interrupted, which indicates, for example, chopping of a load connected between the said second load terminal and the said second supply potential. This second fault state is indicated, independently of whether the semiconductor switch is operated as a high-side switch, as a low-side switch or as a switch arranged in floating fashion, as soon as one of the two loads undergoes chopping, that is, a current flow to one of the two connecting terminals is not possible. For the sake of completeness, it should be pointed out that the load diagnosis is effected, of course, when the semiconductor switch turns off since the first and second connecting terminals of the diagnostic circuit would otherwise be short-circuited.

The load state signal assumes a third state, which indicates a second faulty operation, if a current flows oppositely to the first current direction to the first connecting terminal and/or if a current flows oppositely to the second current direction to the second connecting terminal. A current flows oppositely to the first current direction to the first connecting terminal when the first connecting terminal is not coupled to the first supply potential, but rather to the second supply potential, that is, when a load, for example, is incorrectly connected to the second supply potential, or causes a short circuit with respect to this supply potential. A current flows in the opposite direction to the second current direction to the second connecting terminal when the said second connecting terminal is not coupled to the second supply potential, but rather to the first supply potential, this fault occurring, for example, when a connected load is incorrectly connected to the said first supply potential, or when the load causes a short circuit with respect to the said supply potential.

In order to realize the first current source arrangement, which supplies, depending on the potential conditions at the first connecting terminal, a current in a first current direction or oppositely to the said first current direction to the first connecting terminal. Provision may be made, for example, of a current mirror arrangement that supplies a current provided by a reference current source in the first current direction to the first connecting terminal if the first connecting terminal is connected to the first supply potential, and which supplies this reference current in a direction opposite to the first current direction to the first connecting terminal if the first connecting terminal is connected to the second supply potential. The second current source arrangement may correspondingly be realized as a current mirror which supplies a second reference current in the second current direction to the second connecting terminal if the second connecting terminal is connected to the second supply potential, and which supplies the current in a current direction opposite to the second current direction to the second connecting terminal if the second connecting terminal is connected to the first supply potential.

In one embodiment, the second reference current is dependent on the current to the first connecting terminal. This leads to circuitry simplifications to the effect that only one reference current source has to be provided for the two current mirror arrangements. For example, in a fault case in which no current flows to the first connecting terminal, no current flows to the second connecting terminal either. This has the effect that a fault is indicated at the first connecting terminal with greater reliability and that, on the other hand, a diagnosis of the load state at the second connecting terminal does not occur. This does not have negative consequences, however, owing to the fault state indicated anyway at the first connecting terminal.

In order to simplify the evaluation of the currents flowing to the first and second connecting terminals, one embodiment of the invention provides for the sum of the currents to the first and second connecting terminals to be evaluated and for this sum to be compared with a first and a second reference value, which are of different magnitudes, in order to provide the load state. Assuming that the second reference value is greater than the first reference value, it is thereby possible to distinguish three cases, a first case, in which the summation signal is greater than the second reference value, a second case in which the summation signal lies between the first and second reference values and a third case in which the summation signal is less than the second reference value. These three cases correspond to the three states of the load state signal indicating normal operation, the first fault state and the second fault state.

The method according to one embodiment of the invention for load diagnosis of a switch having a first and a second load connecting terminal provides for the provision of a first current source arrangement in accordance with the above explanations, which can be connected to the first load connecting terminal of the switch, a second current source arrangement in accordance with the above explanations, which can be connected to the second load connecting terminal of the switch, and for the evaluation of the currents flowing to the first and second connecting terminals in order to provide the load state signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 11 illustrates, in tabular form, the switching states of output signals of the circuit in accordance with FIGS. 7–10 depending on various operating states.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
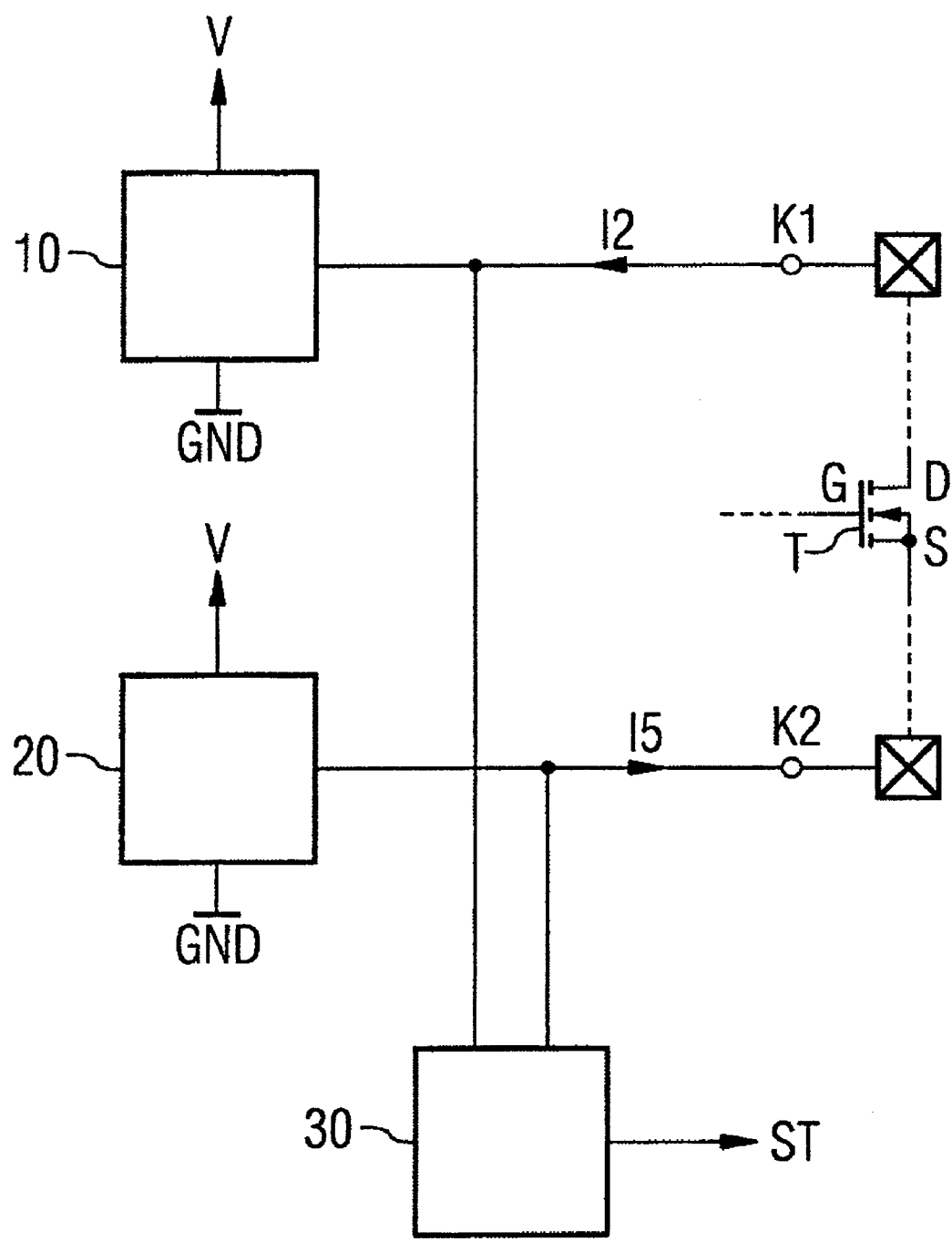
FIG. 1 schematically illustrates a circuit arrangement according to the invention for load diagnosis of a semiconductor switch.

FIG. 1 schematically illustrates an exemplary embodiment of a circuit arrangement according to one embodiment of the invention for load diagnosis of a semiconductor switch. Such a semiconductor switch T, designed as a MOSFET, is represented by broken lines in FIG. 1. The circuit arrangement comprises a first current source arrangement 10 with a first connecting terminal K1, which can be connected to a first load connecting terminal, the drain terminal D of the MOSFET T in the example. The circuit arrangement furthermore comprises a second current source arrangement 20 with a second connecting terminal K2, which can be connected to a second load connecting terminal, the source terminal S of the MOSFET T in the example. The first current source arrangement 10 is designed to supply a current I2 to the first connecting terminal K1, the direction of the said current being dependent on whether the first connecting terminal K1 is coupled to a first or a second supply potential, as will be explained below with reference to FIGS. 2–4. For illustration purposes, it is assumed below that the first current direction of the current I2 corresponds to the current direction depicted in FIG. 1, that is, a current flows from the first connecting terminal K1 in the direction of the current source arrangement 10.

The second current source arrangement 20 is designed to supply, depending on whether the second connecting terminal K2 is connected to a first or a second supply potential, a current I5 to the said second connecting terminal K2 in a second direction or oppositely to the second direction. For illustration purposes, it is assumed below that the second current direction corresponds to the current direction depicted in FIG. 1, in the case of which the current I5 flows from the second current source arrangement 20 to the second connecting terminal K2.

The circuit arrangement additionally comprises an evaluation circuit 30, which evaluates the currents I2, I5 to the first and second connecting terminals K1, K2 at least with regard to their current direction, and which provides, depending on this evaluation, a load state signal ST dependent on the load state determined.

The functioning of this circuit arrangement in accordance with FIG. 1 is explained below with reference to FIGS. 2–4 for different operating modes of the semiconductor switch T.

Figure 2:
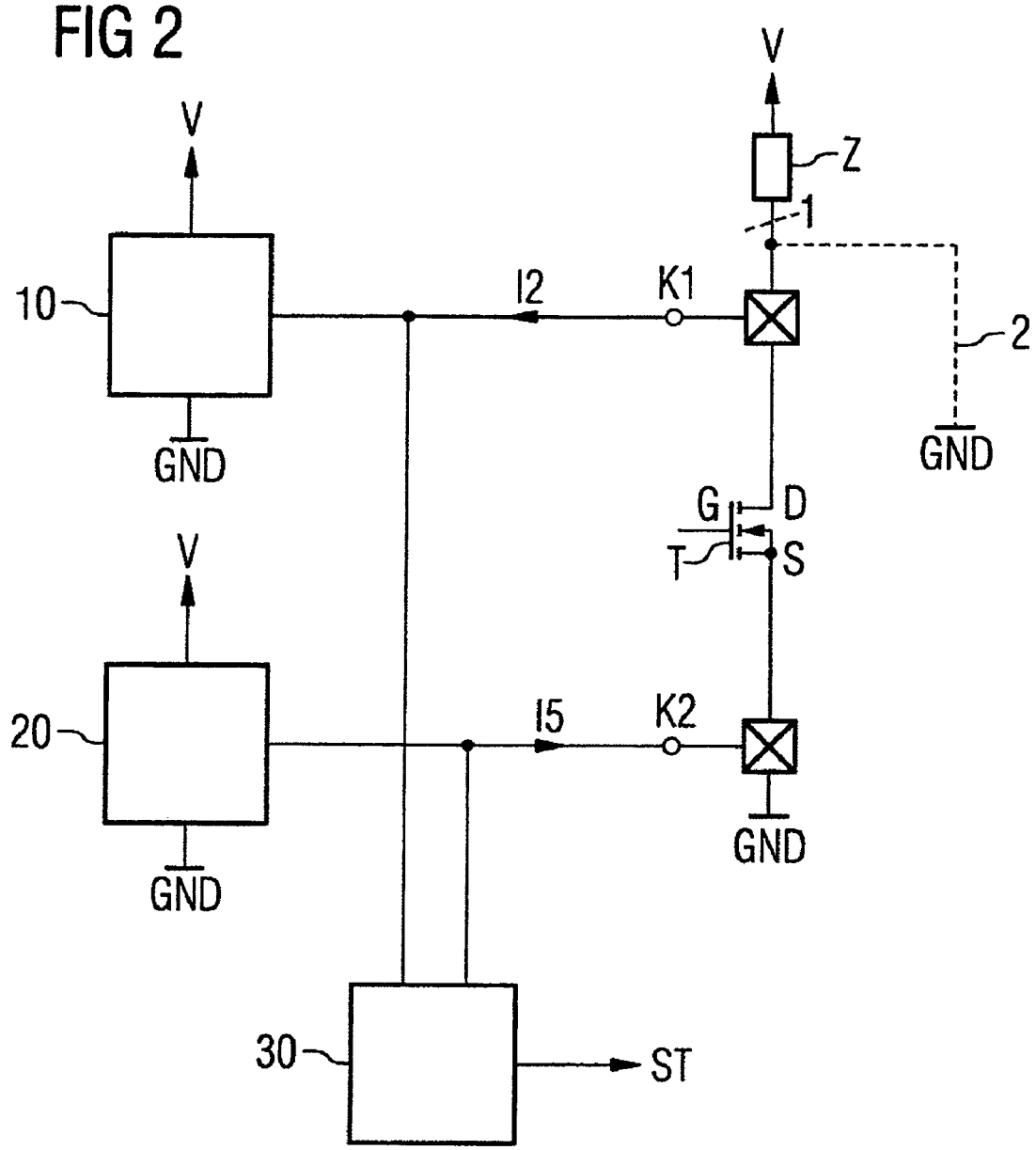
FIG. 2 illustrates the circuit in accordance with FIG. 1 together with a semiconductor switch used as a low-side switch for illustrating various fault states.

FIG. 2 illustrates the circuit arrangement for the diagnosis of a MOSFET T used as a low-side switch, in the case of which a load Z is connected between a first supply potential V, corresponding to a positive supply potential in the example, and drain terminal D of the said MOSFET. The source terminal S of the MOSFET T is at a second supply potential GND, corresponding to reference-earth potential or earth in the exemplary embodiment.

In normal operation, the first connecting terminal K1 of the diagnosis circuit is coupled to the first supply potential V via the load Z, so that the current I2 flows in the first current direction illustrated, and the second connecting terminal K2 is coupled to the second supply potential GND so that the current I5 flows in the second current direction, that is to say from the second current source arrangement 20 to the second connecting terminal K2. In this case, the evaluation circuit 30 supplies a load state signal ST which assumes a first state, which indicates a normal operation of the semiconductor switch.

If the fault which is designated by "1" and is represented by broken lines in FIG. 2 occurs, in the case of which the line connection between the load Z and the drain terminal D of the MOSFET T is interrupted, then no current can flow from or to the first connecting terminal K1, and so the current I2 is zero. In this case, the evaluation circuit 30 supplies a state signal ST which assumes a second state, which indicates this load interruption 1.

In FIG. 2, a second fault state is designated by "2", in the case of which the first connecting terminal K1 is coupled to the second supply potential GND. Such a fault may result for example from an incorrect connection of the load to the second supply potential GND instead of the first supply potential V. The first current source arrangement 10 is designed, in the event of this fault case, to supply a current I2 oppositely to the first current direction depicted in FIG. 2. In this case, the evaluation circuit 30 evaluating this current flow supplies a state signal ST which assumes a third operating state, which indicates this incorrect connection of the drain terminal D of the MOSFET T to reference-earth potential GND. It should be pointed out that in order to detect this fault state, the drain terminal D and the first connecting terminal K1, respectively, do not have to be connected directly to the second supply potential GND, rather this connection may, of course, also be effected via a load.

Figure 3:
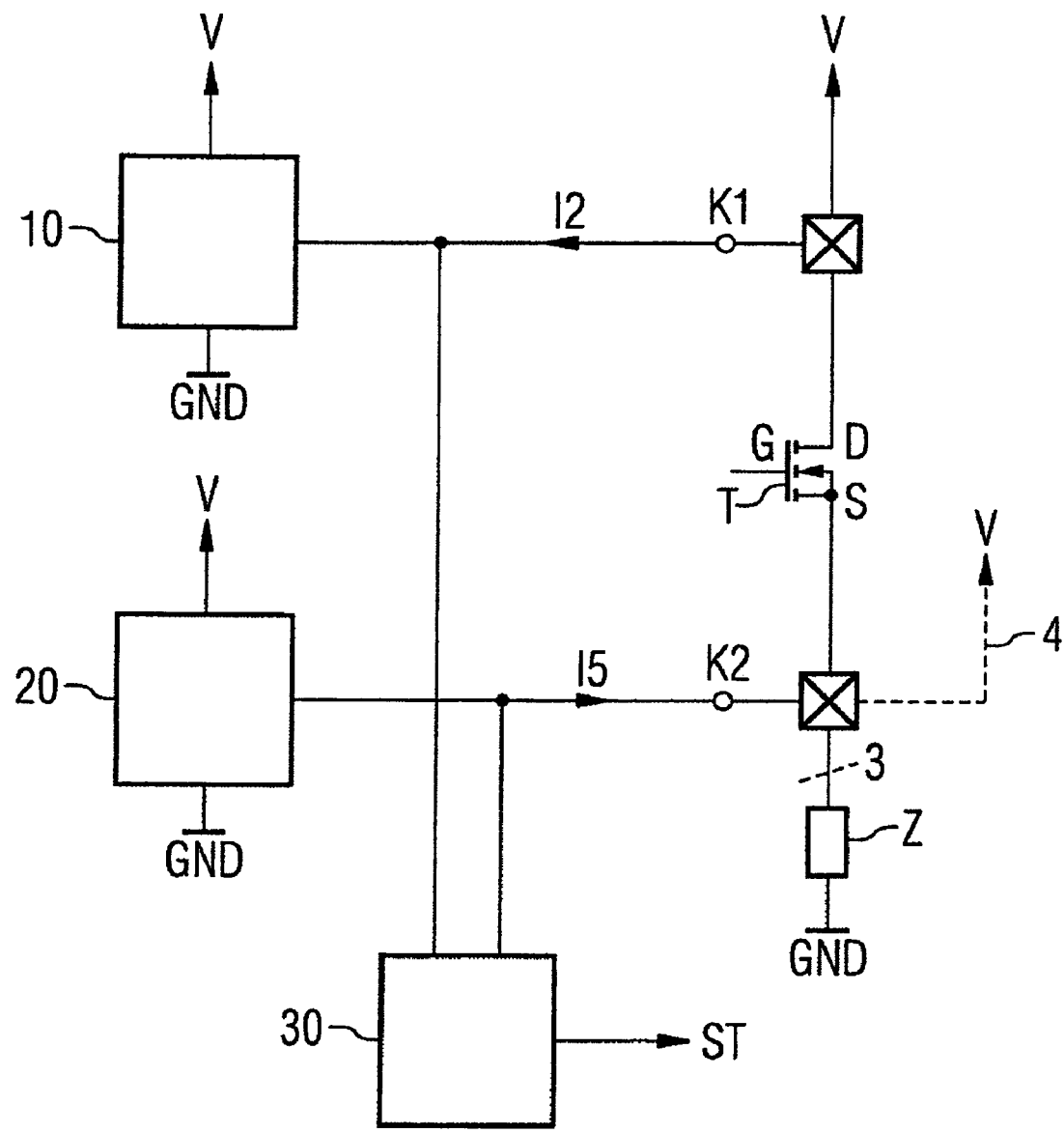
FIG. 3 illustrates a circuit arrangement in accordance with FIG. 1 with a semiconductor switch used as a high-side switch for illustrating various fault states.

FIG. 3 illustrates the circuit arrangement for diagnosis of a MOSFET T used as a high-side switch, the drain terminal D of the MOSFET being connected to the first supply potential V and a load Z being connected between the source terminal S of the MOSFET and the second supply potential GND. The first connecting terminal K1 is thus coupled to the first supply potential V and the second connecting terminal K2 is coupled, in disturbance-free operation, via the load Z to the second supply potential GND. Consequently, a current I2 flows in the depicted direction from the first connecting terminal K1 to the first current source arrangement 10 and a current I5 flows in the depicted direction from the second current source arrangement 20 to the second connecting terminal K2. It should be pointed out that the magnitudes of these currents differ in the interconnection in accordance with FIG. 2 and the interconnection in accordance with FIG. 3, which does not lead to differences with regard to the evaluation result, however, since, in principle, only the direction of the said currents is detected and the fact of whether the said currents are zero or not equal to zero is detected.

FIG. 3 illustrates a fault case designated by "3" in the case of which there is an interruption between the source terminal S and the load Z. Consequently, with MOSFET T turned off, no current can flow, so that the evaluation circuit 30 provides a state signal ST with a second state, which indicates such load chopping.

FIG. 3 illustrates a further fault case, designated by "4" in the case of which the source terminal S is coupled to the first supply potential, which may be effected for example as a result of an incorrect connection of the load. In this case, the current source arrangement 20 provides a current I5 which flows counter to the current direction depicted in FIG. 3. In this case, the evaluation circuit 30 provides a load state signal ST with a third state, which indicates this incorrect connection of this source terminal S. As in the case explained previously with reference to FIG. 2, in order to detect this fault state, the source terminal S does not, of course, have to be connected directly to the first supply potential V, but rather may also be connected via a load to the said supply potential V.

Figure 4:
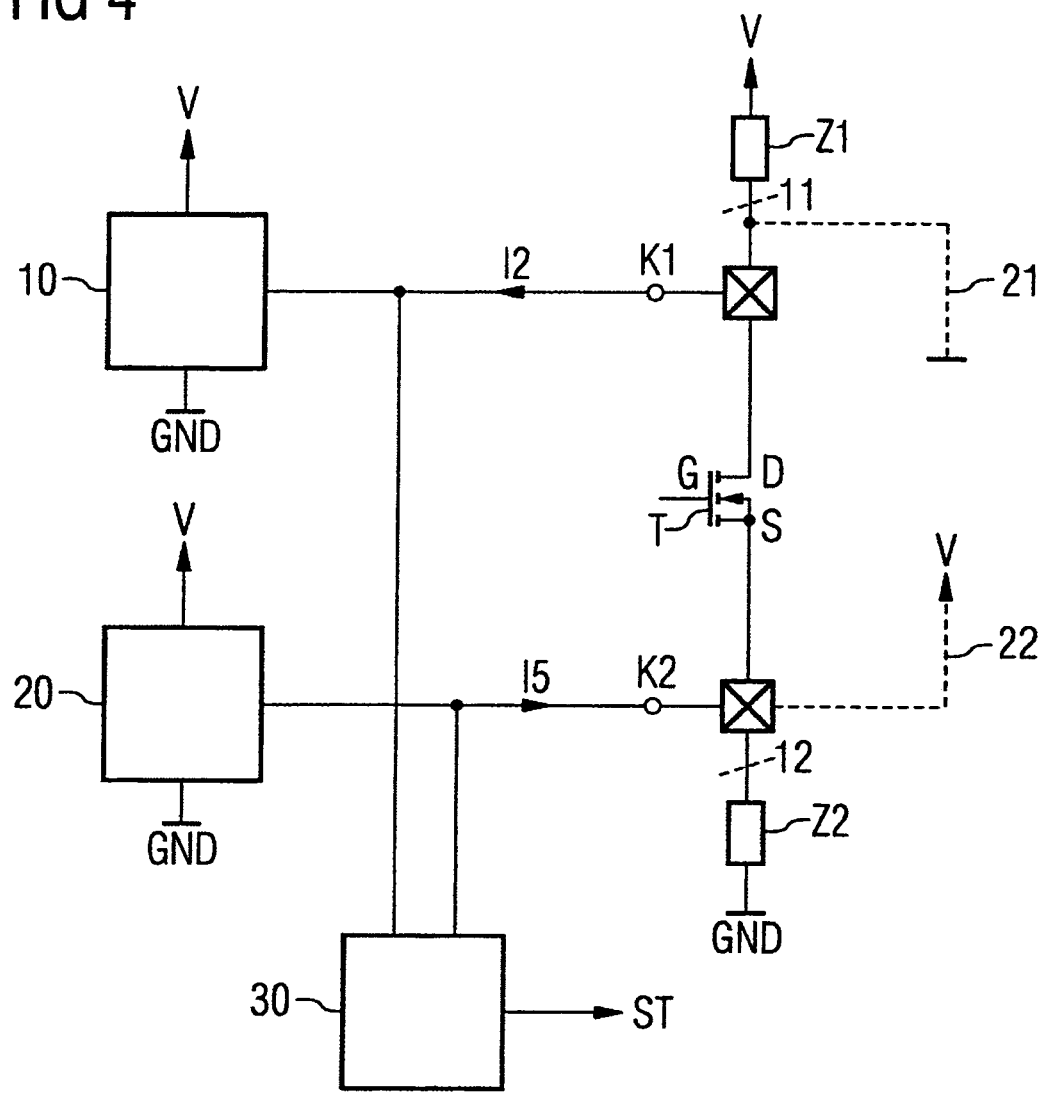
FIG. 4 illustrates a circuit arrangement in accordance with FIG. 1 with a semiconductor switch used as a switch arranged in floating fashion for illustrating various fault states.

FIG. 4 illustrates the circuit arrangement with a MOSFET T arranged in floating fashion in the case of which a first load Z1 is connected between the first supply potential V and the drain terminal D and a second load Z2 is connected between the source terminal S and the second supply potential GND.

In normal operation, the first connecting terminal K1 is coupled to the first supply potential V via the first load Z1, thereby bringing about a current I2 in the depicted direction through the current source arrangement 10. Correspondingly, the second connecting terminal K2 is coupled via the second load Z2 to the second supply potential GND, thereby bringing about a current I5 in the depicted second direction from the second current source arrangement 20. The evaluation circuit 30 provides a state signal ST with a first state, which indicates a disturbance-free operation.

In FIG. 4, "11" designates a fault case in which the connection between the first load Z1 and the drain terminal D is interrupted, so that the current I2 is zero. In this case, the evaluation circuit 30 provides a state signal ST with a second state, indicating the load interruption. In FIG. 4, "12" designates the fault case in which the connection between the second load Z2 and the source terminal S is interrupted. In this case, the current I5 becomes zero, so that the evaluation circuit 30 provides a load state signal which likewise has the second state, which indicates this load interruption.

In FIG. 4, "21" designates a fault case in which the drain terminal D of the MOSFET is coupled to the second supply potential GND. In this case, the current source arrangement 10 brings about a current oppositely to the first current direction depicted in FIG. 4. In this case, the evaluation circuit 30 provides a state signal ST which has the third state, which indicates the incorrect interconnection of the said drain terminal D.

In FIG. 4, "22" designates the fault case in which the source terminal S is incorrectly coupled to the first supply potential V. In this case, the second current source arrangement 20 brings about a current I5 to the second connecting terminal K2 which flows oppositely to the second current direction depicted in FIG. 4. In this case, the evaluation circuit 30 supplies a state signal which assumes the third state, which indicates this incorrect interconnection of the source terminal S.

Of course, the evaluation circuit 30 also supplies a state signal ST having the second state when both the fault case "11" and the fault case "12" are present. Correspondingly, a load state signal ST is provided which assumes the third state if both the fault case "21" and the fault case "22" are present.

Figure 5:
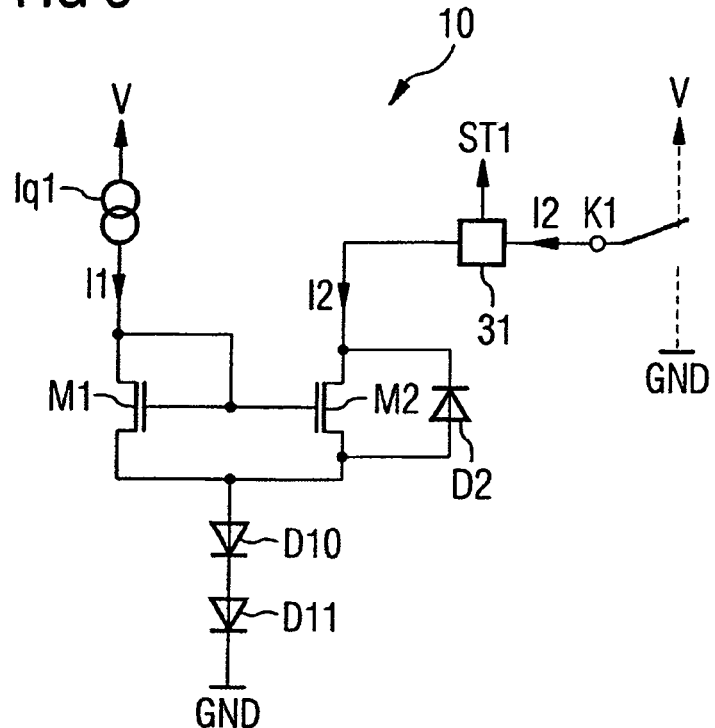
FIG. 5 illustrates an example of the circuitry realization of a current source arrangement for connection to a first connecting terminal.

FIG. 5 illustrates an example of the circuitry realization of the first current source arrangement, which brings about a current I2 in the first current direction depicted in FIGS. 1–3 or oppositely to this first current direction, depending on the polarity of the first connecting terminal K1. The current source arrangement 10 comprises a reference current source Iq1, which supplies a reference current I1 to a current mirror having a first and a second transistor M1, M2. The current mirror transistors M1, M2 are designed as n-channel MOSFET in the example. The source terminals of these transistors M1, M2 are connected to reference-earth potential via at least two diodes D10, D11, the anode of one of the two diodes being connected to the source terminals of the transistors M1, M2. The two diodes D10, D11 illustrated may also be designed in each case as a transistor connected up as a diode.

The transistor M1 of the circuit, this transistor being connected downstream of the reference current source Iq1, is connected up as a diode. The drain terminal of the other transistor M2 is coupled to the first connecting terminal K1 via a current sensing circuit 31. The transistor M2 has an integrated backward or body diode, which is explicitly illustrated in the example and is designated by the reference symbol D2.

If the first connecting terminal K1 is at the first supply potential V, then a current I2 flows in the first direction from the said connecting terminal K1 via the current mirror transistor M2 and via the diodes D10, D11 to reference-earth potential GND, this current I2 being related to the reference current I1 by way of the ratio of the current mirror M1, M2.

If the first connecting terminal K1 is at reference-earth potential GND, then the reference current I1 flows via the first current mirror transistor M1 and the backward diode D2 of the second current mirror transistor M2 to the connecting terminal K1, so that a current flows counter to the first current direction depicted in FIG. 5. Assuming that the voltage drop across the current sensing circuit 31 and across the line between the current sensing circuit 31 and reference-earth potential GND together is less than a diode forward voltage if a voltage which is less than twice a diode forward voltage is present between the source terminals of the two transistors M1, M2 and reference-earth potential. The use of at least two diodes in the diode chain D10, D11 ensures that no current flows via this diode chain D10, D11 to reference-earth potential GND, so that the current flows completely via the backward diode D2 and the current sensing circuit 31.

Figure 6:
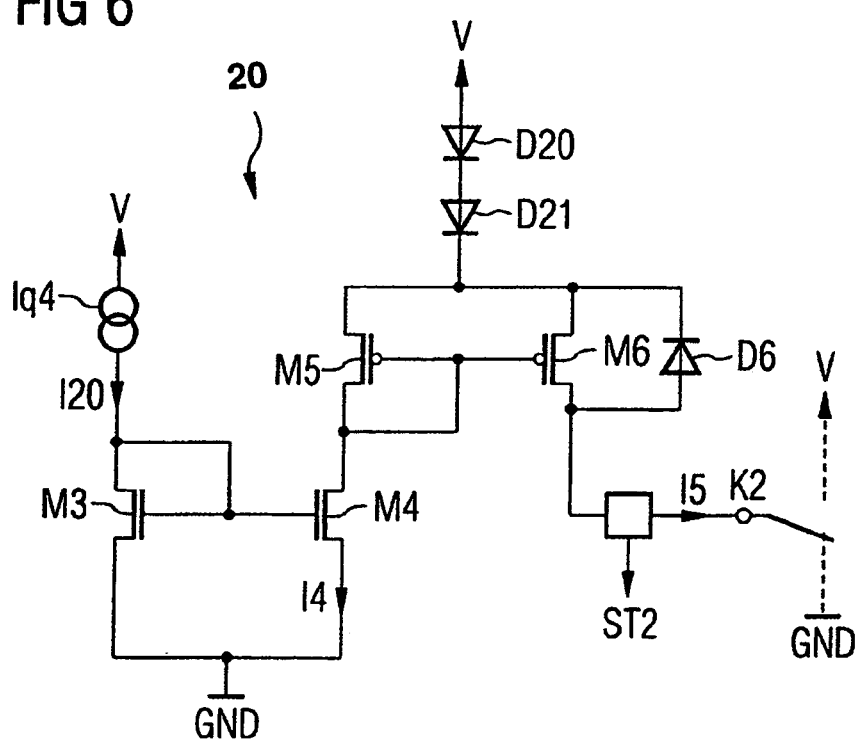
FIG. 6 illustrates an example of the circuitry realization of a current source arrangement for connection to the second connecting terminal.

FIG. 6 illustrates an example of the circuitry realization for the second current source arrangement 20. This circuit arrangement comprises a second reference current source Iq4, which supplies a second reference current I2 to a current mirror having two n-channel transistors M3, M4, the source terminals of which are connected to the second supply potential GND. The circuit arrangement comprises a second current mirror having p-channel transistors M5, M6, the source terminals of which are connected to the first supply potential V via a diode chain having at least two diodes D20, D21, the anode of one of the diodes D20, D21 being connected to supply potential V. This second current mirror M5, M6 is coupled to the first current mirror M3, M4, the drain terminal of the transistor M5 being connected to the drain terminal of the transistor M4. The drain terminal of the further transistor M6 of the second current mirror M5, M6 is coupled to the second connecting terminal K2. The second reference current I20 supplied by the second reference current source Iq4 brings about, via the current mirror M3, M4, a current I4 through the second transistor M4 of the first current mirror and the first transistor M5 of the second current mirror. If the second connecting terminal K2 is coupled to the second supply potential GND, which corresponds to normal operation, then a current I5 flows in the second current direction detected, which current, by way of the current mirror ratio of the second current mirror, is related to the current I4 and thus to the second reference current I20, to the second connecting terminal K2. If the second connecting terminal K2 is coupled to the first supply potential V directly or via a load, then a current I5 flows oppositely to the second direction depicted from the second connecting terminal K2 via a backward diode D6 of the second current mirror transistor M6 of the second current mirror, via the first current mirror transistor M50 of the said second current mirror and the current mirror transistor M40 to reference-earth potential GND.

In the manner explained below, in the case of the circuit arrangement according to one embodiment of the invention, a state signal ST with a first state is provided if a disturbance-free operation of the semiconductor switch T is present, to be precise independently of whether the semiconductor switch is used as a high-side switch, as a low-side switch or as a floating switch.

The state signal ST has a second state, which indicates a load chopping, to be precise, independently of whether the semiconductor switch T is used as a high-side switch, as a low-side switch or as a floating switch.

Moreover, the state signal ST has a third state, which indicates a connection of one of the two load terminals or both load terminals to the "incorrect" supply potential, to be precise, independently of whether the semiconductor switch is used as a high-side switch, as a low-side switch or as a floating switch.

Figure 7:
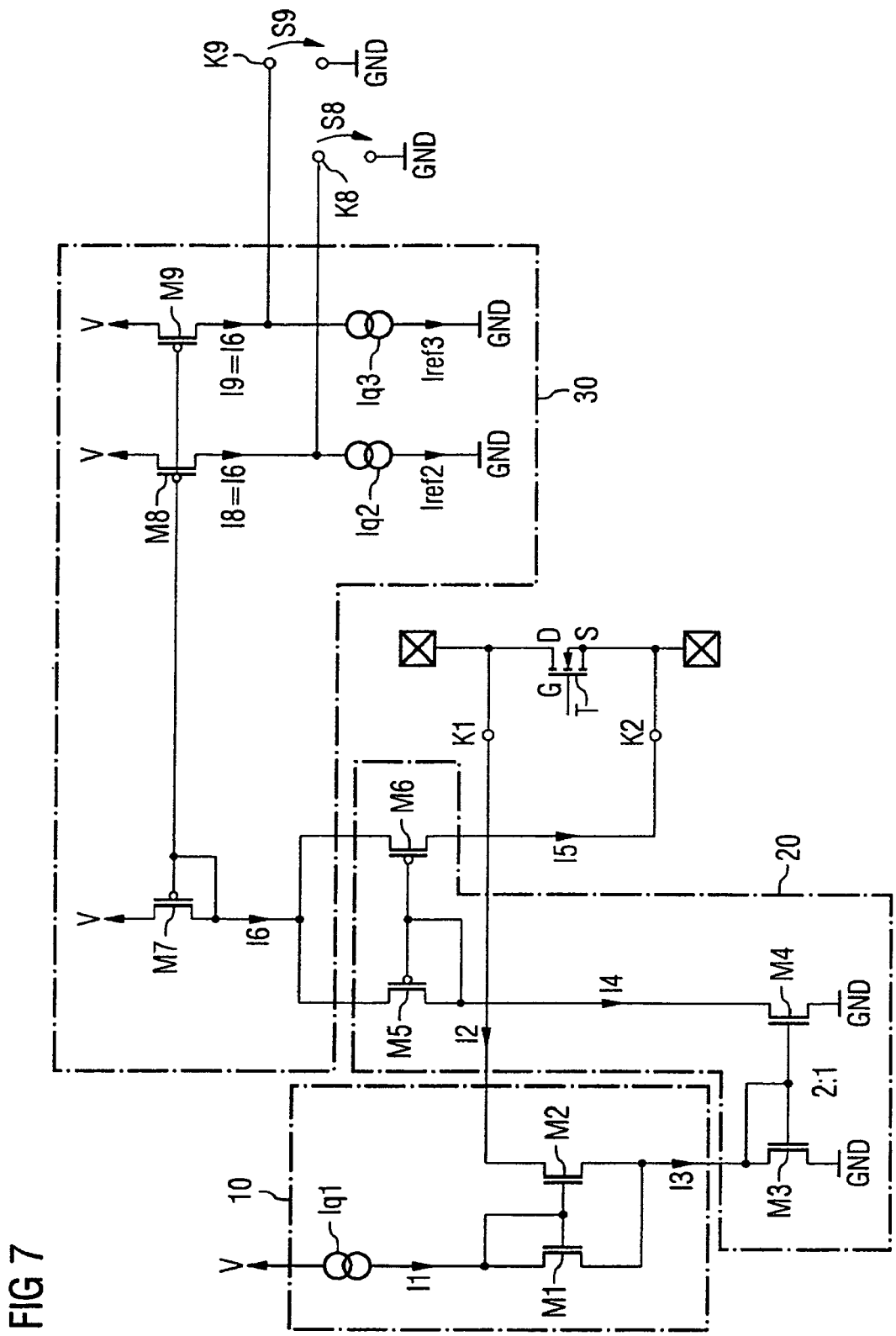
FIG. 7 illustrates an advantageous example of the circuitry realization of the first and second current source arrangements and of the evaluation circuit.

FIG. 7 illustrates an exemplary embodiment of the circuit arrangement according to the invention with the first current source arrangement 10, the second current source arrangement 20 and the evaluation circuit 30, which exemplary embodiment can be realized with a comparatively low circuitry outlay.

A semiconductor switch T to be monitored, designed as a MOSFET, is represented by broken lines in FIG. 7.

In the exemplary embodiment, the first current source arrangement 10 comprises a reference current source Iq1 connected between the first supply potential V and a current mirror having two n-channel transistors M1, M2. The reference current source Iq1 supplies a first reference current I1. The current mirror transistor M1 connected downstream of the current source Iq1 is connected up as a diode. The source terminals of the two transistors M1, M2 are connected to one another and the drain terminal of the second current mirror transistor M2 is connected to the first connecting terminal K1. The circuit having the first reference current source Iq1 and the first and second current mirror transistors M1, M2 corresponds to the circuit having the reference current source Iq1 and the current mirror transistor M1, M2 in FIG. 5. At the node common to the current mirror transistors M1, M2, a current I3 is available, which serves as a reference current for the second current source arrangement 20, the construction of which corresponds, moreover, to the construction of the current source arrangement in accordance with FIG. 6, with the difference that the source terminals of the current mirror transistors M5, M6 are connected to the first supply potential V via a transistor M7 of a further current mirror that is yet to be explained. In FIG. 7, the current mirror transistor M3 serves as a load for the current mirror M1, M2 instead of the diode chain D10, D11 in accordance with FIG. 5.

In one embodiment, the first current mirror M3, M4 of the second current source arrangement 20 has a current mirror ratio of 2:1, which will be explained below.

In order to determine the load state, in the circuit arrangement in accordance with FIG. 7, a current I6 flowing into the second current mirror M5, M6 of the second current source arrangement 20 is evaluated. For this purpose, the said current I6 is compared with a reference current Iref2, provided by a reference current source Iq2, and with a reference current Iref3, provided by a further reference current source Iq3, in order to provide, depending on this comparison result, a first and second two-valued output signal S8, S9, which jointly represent the state signal ST.

The evaluation circuit 30 comprises a current mirror in which the current I6 is mapped onto a current I8 by means of current mirror transistors M7, M8, the current mirror transistor M8 being connected in series with the reference current source Iq2 between the first supply potential V and the second supply potential GND. The first signal S8 can be tapped off at a node common to the current mirror transistor M8 and the reference current source Iq2. The current mirror ratio of the current mirror ratio formed by the transistors M7, M8 is preferably 1:1, so that the current I8 corresponds to the current I6. The first output signal S8 assumes a high level if the said current I6 is greater than the reference current Iref2. The current I6 is correspondingly compared with the reference current Iref3. For this purpose, a current mirror transistor M9 coupled to the current mirror transistor M7 is provided, and is coupled in series with the further reference voltage source Iq3 between the first supply potential V and the second supply potential GND. The second signal S9 can be tapped off at the node common to the current mirror transistor M9 and the reference current source Iq3, this signal assuming a high level if the current I6 is greater than the reference current Iref3, and assuming a low level if the current I6 is less than the reference current Iref3.

Figure 8:
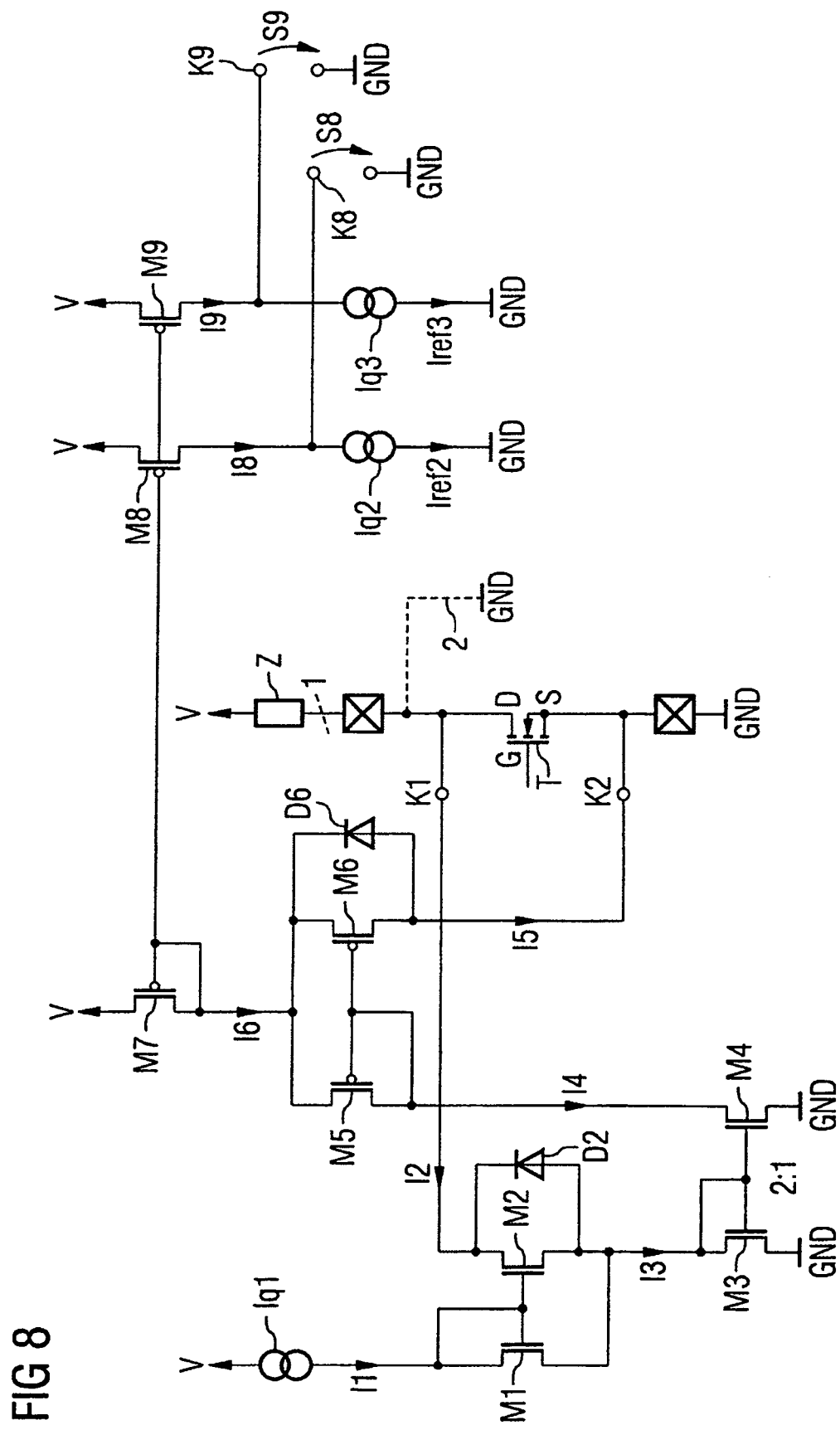
FIG. 8 illustrates the circuit arrangement in accordance with FIG. 7 together with a semiconductor switch used as a low-side switch for illustrating various fault states.
Figure 9:
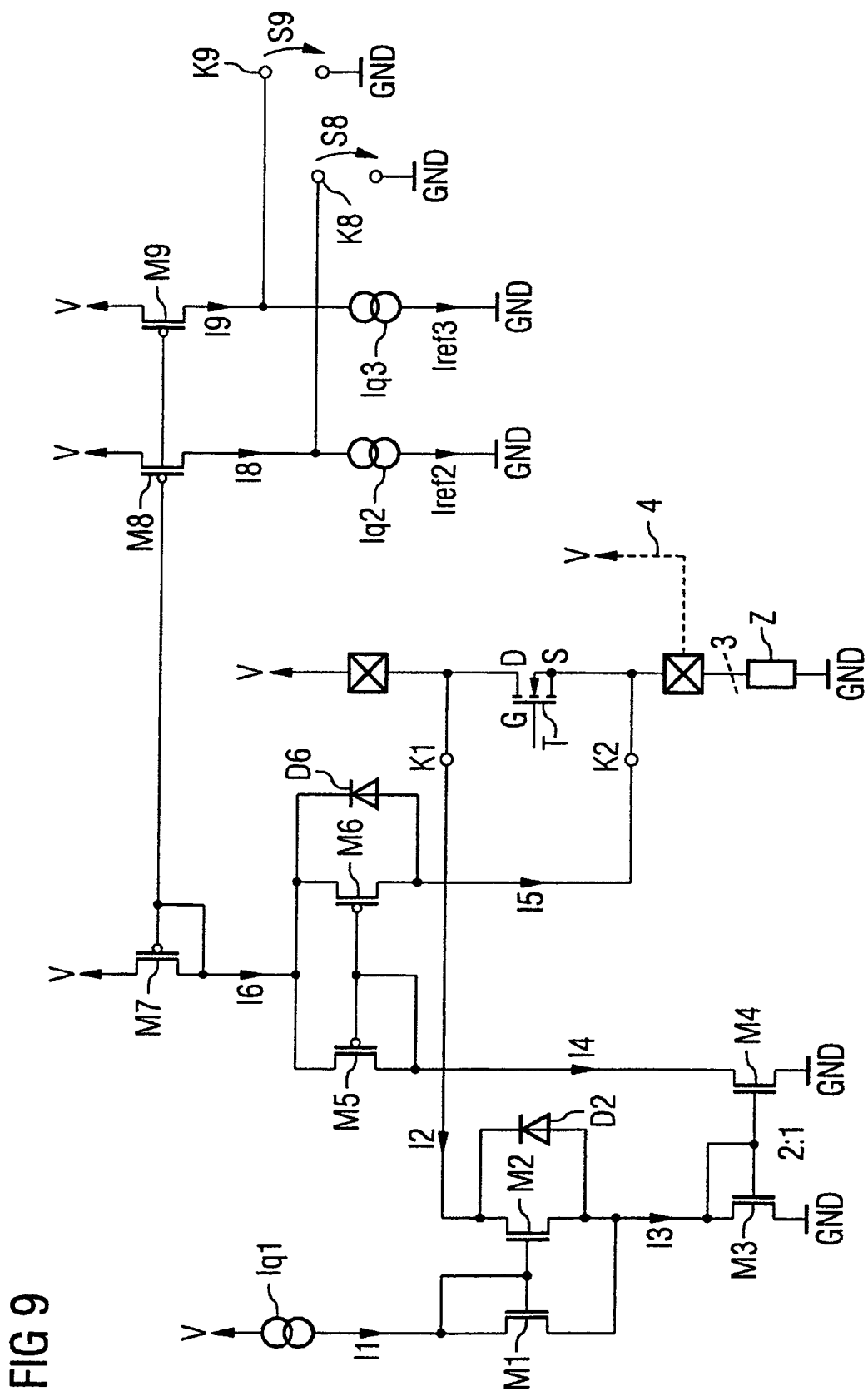
FIG. 9 illustrates a circuit arrangement in accordance with FIG. 7 together with a semiconductor switch used as a high-side switch for illustrating various fault states.
Figure 10:
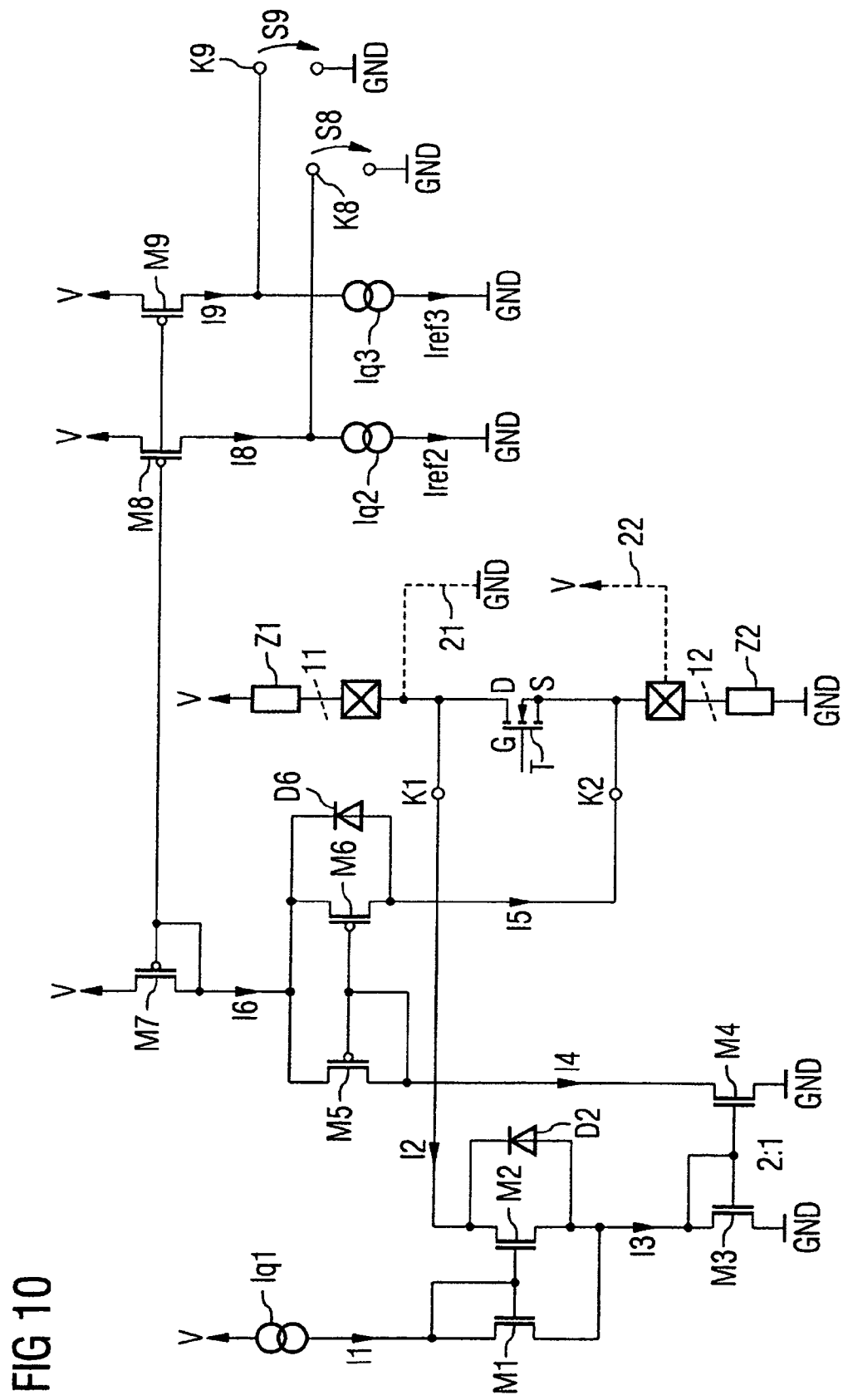
FIG. 10 illustrates a semiconductor switch used as a switch arranged in floating fashion for illustrating various fault states.

The functioning of this circuit arrangement in accordance with FIG. 7 is explained in more detail below with reference to FIGS. 8–10, FIG. 8 showing the circuit arrangement in connection with a semiconductor switch T used as a low-side switch, FIG. 9 showing the circuit arrangement in connection with a semiconductor switch T used as a high-side switch, and FIG. 10 showing the circuit arrangement in connection with a semiconductor switch arranged in floating fashion.

In all three cases, a normal operation of the semiconductor switch T is present when the drain terminal D, that is, the first connecting terminal K1 of the diagnosis circuit, is connected to the first supply potential V directly (in high-side operation) or via a load (in low-side operation or floating operation), and when the source terminal S is connected to the second supply potential GND directly (in low-side operation) or via a load (in high-side operation or floating operation).

A current I2 then flows from the first connecting terminal K1 in the first direction depicted in the figures via the current mirror transistors M2, M3 to reference-earth potential GND. The magnitude of this current I2 corresponds to the first reference current I1. The reference current I3 of the second current source arrangement 20, which corresponds to the sum of the first reference current I1 and the said current 12, corresponds to twice the said first reference current I1, so that the following holds true: I3=I1+I2=2·I1. Taking account of the current mirror ratio 2:1 of the current mirror transistors M3, M4 of the second current source arrangement 20, the current I4=I1. This current I4 is mapped via the second current mirror M5, M6 one to one onto the current I5 to the second connecting terminal K2, so that the following holds true: I5=I1. The following then holds true for the current I6: I6=I4+I5=2·I1.

The second reference current Iref2 is chosen such that it is less than twice the first reference current I1, so that the following holds true: Iref2<2·I1. Moreover, the further reference current Iref3 is less than the second reference current, that is to say Iref3<Iref2. It then holds true in normal operation that the current I6 is greater than the second and third reference currents Iref2, Iref3, so that the first and second output signals S8, S9 are at a high level. This result can also be gathered from the table in FIG. 11, which illustrates the value of the current I6 and also the levels of the signal S8, S9 of the diagnostic circuit for various operating states of the semiconductor switch T.

In the case of low-side operation in accordance with FIG. 8, "1" designates a fault case in which the line connection between the load Z and the drain terminal of the MOSFET is interrupted. In this case, the current I2 is equal to zero, and the reference current I3 of the second current source arrangement 20 corresponds to the first reference current I1, so that the following holds true: I3=I1. Owing to I4=0.5·I3 and I4=I5, the following holds true: I6=I1.

The second reference current Iref2 is greater than the first reference current I1, so that the output signal S8 assumes a low level in the event of this fault case of a chopped load. The third reference current Iref3, which is less than the second reference current Iref2, is less than the said first reference current I1, so that the second output signal S9 assumes a high level.

A corresponding situation with a current I6 corresponding to the first reference current I1 results in the event of the fault case designated by "11" in FIG. 10, in which there is an interruption of the connection between the first load Z1 and the drain terminal D.

In FIG. 8, "2" designates one of the other faults, in the case of which the drain terminal of the MOSFET T is coupled to reference-earth potential GND instead of the first supply potential V. In this case, the first reference current I1 flows via the current mirror transistor M1 and the integrated backward diode D2 of the current mirror transistor M2 to the first connecting terminal K1. In this case, the magnitude of the second current I2 corresponds to the first reference current I1. In this case, however, the current I2 flows counter to the first current direction depicted in FIG. 8 to the first connecting terminal K1. The summation current I3 and thus the current I4 through the first current mirror of the second current source arrangement 20 is thus zero. Correspondingly, the current I5 to the second connecting terminal K2, and thus the current I6 as well, is equal to zero. The following thus holds true: I3=I4=I5=I6=0. Thus, both output signals S8, S9 at the output of the evaluation circuit 30 have a low level.

This fault also corresponds to the fault case designated by "21" in FIG. 10, in the case of which, with a floating semiconductor switch T, the drain terminal is coupled to the second supply potential GND. In this case, too, the following holds true: I3=I4=I5=I6=0, as a result of which the two output signals S8, S9 at the output of the evaluation circuit 30 assumes a low level.

In FIG. 9, "3" designates a fault case in which, in high-side operation of the semiconductor switch T, the connection between the source terminal S and the load Z is interrupted, while no fault is present at the drain terminal of the semiconductor switch T. In this case, the following holds true for the current I3 in accordance with the fault-free case: I3=2·I1 and thus I4=I1. The current I5 to the second connecting terminal K2 is zero, so that I6=I1 holds true. In this case, in accordance with the fault case "1" already explained above, the output signal S8 assumes a low level, while the second output signal S9 assumes a high level.

Correspondingly, the first output signal S8 assumes a low level and the second output signal S9 assumes a high level if, in the event of the fault case designated by "12" in FIG. 10, a load interruption occurs between the source terminal S and the second load Z2.

In this case, too, the following holds true for the current I6 in the case of a fault-free interconnection of the drain terminal D: I6=I1.

Referring to FIG. 10, consideration shall be given to the case in which both the fault "11" and the fault "12" are present, two load interruptions being present. In this case, both the current I2 to the first connecting terminal K1 and the current I5 to the second connecting terminal K2 are zero. The current I3 corresponds to the first reference current, so that the following holds true: I3=I1. The following then holds true for the current I6: I6=I4=0.5·I1. I6 is thus less than the second reference current Iref2, for which the following holds true: I1<Iref2<2·I2. The following holds true for Iref3: 0<Iref3<0.5·I1. In the case just explained, I6 is thus greater than the third reference current Iref3 so that the second output signal S9 assumes a high level.

To summarize it must be emphasized that, in the event of a load interruption, the first output signal S8 assumes a low level and the second output signal S9 assumes a high level, provided that the above conditions for the second reference current Iref2 and the third reference current Iref3 are met. This output signal constellation results for each of the possible load interruptions, namely load interruption in low-side operation (FIG. 8), in high-side operation (FIG. 9) and in floating operation both in the event of interruption of only one load and in the event of interruption of both loads.

In FIG. 9, "4" designates a fault case in which, in high-side operation, the source terminal of the MOSFET is coupled to the first supply potential V instead of the second supply potential GND. In the case of a fault-free connection of the drain terminal D, the following holds true for the current I4 through the current mirror transistor M4 in the manner explained above: I4=0.5·I3=I1. This current I4 through the first current mirror transistor M5 of the second current mirror M5, M6 and the second current mirror transistor M4 of the first current mirror M3, M4 is supplied by the current I5 which flows via the backward diode D6 of the current mirror transistor M6 counter to the second current direction illustrated in FIG. 9. The following holds true in this case for the current I6: I6=0. In the case of such an output current I6=0, both output signals S8, S9 are at a low level, in the manner already explained above, in order to indicate the incorrect interconnection of the source terminal of the MOSFET T.

A corresponding constellation results in the case of the fault designated by "22" in FIG. 10, in the case of which the source terminal S is coupled to the first supply potential V, assuming that the drain terminal D of the MOSFET T is correctly interconnected.

Finally, consideration shall be given to the fault in the case of which the drain terminal D of the MOSFET is coupled to reference-earth potential GND, so that the fault "21" is present, and in the case of which the source terminal of the MOSFET is connected to the first supply potential V so that the fault "22" is present. In accordance with the fault case "2" the current I4 is zero in this case, as a result of which the current I5 is also equal to zero, so that the following holds true: I4=I5=I6=0. A signal constellation S8, S9 in which both signals are at a low level correspondingly results. If, in summary, the listing in FIG. 11 is considered, then it becomes clear that identical output signals result for identical circuit states independently of the interconnection of the semiconductor switch as a high-side switch, as a low-side switch or as a floating switch. In other words, in normal operation, the two signals S8, S9 are always at a high level. In the case of a load chopping, it always holds true that the first signal S8 assumes a low level, while the second signal S9 assumes a high level, and, when a load terminal of the MOSFET is connected to the "incorrect" supply potential, both output signals S8, S9 assume a low level. These three different signal constellations of the first and second output signals S8, S9 correspond to the three states of the load state signal ST, it being possible to consider the load state signal ST as a two-digit binary signal, one bit of this signal being formed by the first signal S8 and the second bit of this signal being formed by the second signal S9.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement for load diagnosis of a switch having a first and a second load connecting terminal, the circuit arrangement comprising:
    a first current source arrangement with a first connecting terminal, which can be connected to the first load connecting terminal of the switch, the first current source arrangement being designed to supply current in a first current direction to the first connecting terminal if the first load terminal is coupled to a first supply potential, and to supply current in a current direction opposite the first current direction to the first connecting terminal if the first load terminal is coupled to a second supply potential;
    a second current source arrangement with a second connecting terminal, which can be connected to the second load connecting terminal of the switch, the second current source arrangement being designed to supply current in a second current direction to the second connecting terminal if the second load terminal is coupled to the second supply potential, and to supply current in a current direction opposite the second current direction to the second connecting terminal if the second load terminal is coupled to the first supply potential; and
    an evaluation circuit, which evaluates the currents flowing to the first and second connecting terminals and provides a load state signal depending on the currents.

2. The circuit arrangement of claim 1, wherein the load state signal assumes a first state, which indicates a fault-free operation, if current flows in the first current direction to the first connecting terminal and current flows in the second current direction to the second connecting terminal.

3. The circuit arrangement of claim 1, wherein the load state signal assumes a second state, which indicates a first faulty operation, if no current flows to the first connecting terminal or if no current flows to the second connecting terminal.

4. The circuit arrangement of claim 1, wherein the load state signal assumes a second state, which indicates a first faulty operation, if no current flows to the first connecting terminal and if no current flows to the second connecting terminal.

5. The circuit arrangement of claim 1, wherein the load state signal assumes a third state, which indicates a second faulty operation, if current flows in the current direction opposite to the first current direction to the first connecting terminal or if current flows in the current direction opposite to the second current direction to the second connecting terminal.

6. The circuit arrangement of claim 1, wherein the load state signal assumes a third state, which indicates a second faulty operation, if current flows in the current direction opposite to the first current direction to the first connecting terminal and if current flows in the current direction opposite to the second current direction to the second connecting terminal.

7. The circuit arrangement of claim 1, wherein the first current source arrangement has a first current mirror, which supplies current proportional to a first reference current in a manner dependent on the potential conditions at the first connecting terminal in the first current direction or in the current direction opposite to the first current direction to the first connecting terminal.

8. The circuit arrangement of claim 7, wherein the second current source arrangement has a second current mirror, which supplies current proportional to a second reference current in a manner dependent on the potential conditions at the second connecting terminal in the second current direction or in the current direction opposite to the second current direction to the second connecting terminal.

9. The circuit arrangement of claim 7, wherein the second reference current is dependent on the current to the first connecting terminal.

10. The circuit arrangement of claim 9, wherein the second reference current is dependent on the sum of the current to the first connecting terminal and the first reference current.

11. The circuit arrangement of claim 10, wherein the evaluation circuit determines the sum of the currents to the first and second connecting terminals and compares this sum with a first and a second reference value in order to provide the load state signal.

12. A method for load diagnosis of a switch having a first and a second load connecting terminal, the method comprising:
    providing a first current source arrangement with a first connecting terminal, which can be connected to the first load connecting terminal of the switch, the first current source arrangement being designed to supply current in a first current direction to the connecting terminal if the first load terminal is coupled to a first supply potential, and to supply current in a current direction opposite to the first current direction to the first connecting terminal if the first load terminal is coupled to a second supply potential;
    providing a second current source arrangement with a second connecting terminal, which can be connected to the second load connecting terminal of the switch, the second current source arrangement being designed to supply current in a second current direction to the second connecting terminal if the second load terminal is coupled to the second supply potential, and to supply current in a current direction opposite to the second current direction to the second connecting terminal if the second load terminal is coupled to the first supply potential; and
    evaluating the currents flowing to the first and second connecting terminals in order to provide a load state signal.

13. The method of claim 12, wherein the load state signal assumes a first state, which indicates a fault-free operation, if current flows in the first current direction to the first connecting terminal and current flows in the second current direction to the second connecting terminal.

14. The method of claim 12, wherein the load state signal assumes a second state, which indicates a first faulty operation, if no current flows to the first connecting terminal or if no current flows to the second connecting terminal.

15. The method of claim 12, wherein the load state signal assumes a second state, which indicates a first faulty operation, if no current flows to the first connecting terminal and if no current flows to the second connecting terminal.

16. The method of claims 12, wherein the load state signal assumes a third state, which indicates a second faulty operation, if current flows in the current direction opposite to the first current direction to the first connecting terminal or if current flows in the current direction opposite to the second current direction to the second connecting terminal.

17. The method of claims 12, wherein the load state signal assumes a third state, which indicates a second faulty operation, if current flows in the current direction opposite to the first current direction to the first connecting terminal and if current flows in the current direction opposite to the second current direction to the second connecting terminal.

18. The method of claim 12, further including providing a current proportional to a first reference current in a manner dependent on the potential conditions at the first connecting terminal in the first current direction or in the current direction opposite to the first current direction to the first connecting terminal.

19. The method of claim 18, further including providing a current proportional to a second reference current in a manner dependent on the potential conditions at the second connecting terminal in the second current direction or in the current direction opposite the second current direction to the second connecting terminal.

20. The method of claim 19, wherein the second reference current is dependent on the current to the first connecting terminal.

* * * * *